(12) United States Patent
Ho et al.

(10) Patent No.: US 9,349,652 B1
(45) Date of Patent: May 24, 2016

(54) METHOD OF FORMING SEMICONDUCTOR DEVICE WITH DIFFERENT THRESHOLD VOLTAGES

(71) Applicant: Taiwan Semiconductor Manufacturing Company, Ltd., Hsin-Chu (TW)

(72) Inventors: Chia-Cheng Ho, Hsin-Chu (TW); Cheng-Yi Peng, Hsin-Chu (TW); Chih Chieh Yeh, Hsin-Chu (TW); Tsung-Lin Lee, Hsin-Chu (TW); Jung-Piao Chiu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/569,096

(22) Filed: Dec. 12, 2014

(51) Int. Cl.
*H01L 21/82* (2006.01)
*H01L 21/8234* (2006.01)

(52) U.S. Cl.
CPC .. *H01L 21/82345* (2013.01); *H01L 21/823431* (2013.01); *H01L 21/823462* (2013.01)

(58) Field of Classification Search
None
See application file for complete search history.

(56) References Cited

U.S. PATENT DOCUMENTS

2015/0255463 A1* 9/2015 Ando .................. H01L 27/0928
257/371

* cited by examiner

*Primary Examiner* — Asok K Sarkar
(74) *Attorney, Agent, or Firm* — Haynes and Boone, LLP

(57) ABSTRACT

A method for fabricating a semiconductor device includes forming a first gate stack over a first fin feature and second gate stack over a second fin feature, removing the first gate stack to form a first gate trench that exposes the first fin structure, removing the second gate stack to form a second gate trench that exposes the second fin feature, performing an annealing process to change a composition of a portion of the first fin feature and forming a first high-k/metal gate (HK/MG) within the first gate trench over the portion of the first fin feature and a second HK/MG within the second gate trench over the second fin feature. Therefore the first HK/MG is formed with a first threshold voltage and the second HK/MG is formed with a second threshold voltage, which is different than the first threshold voltage.

20 Claims, 16 Drawing Sheets

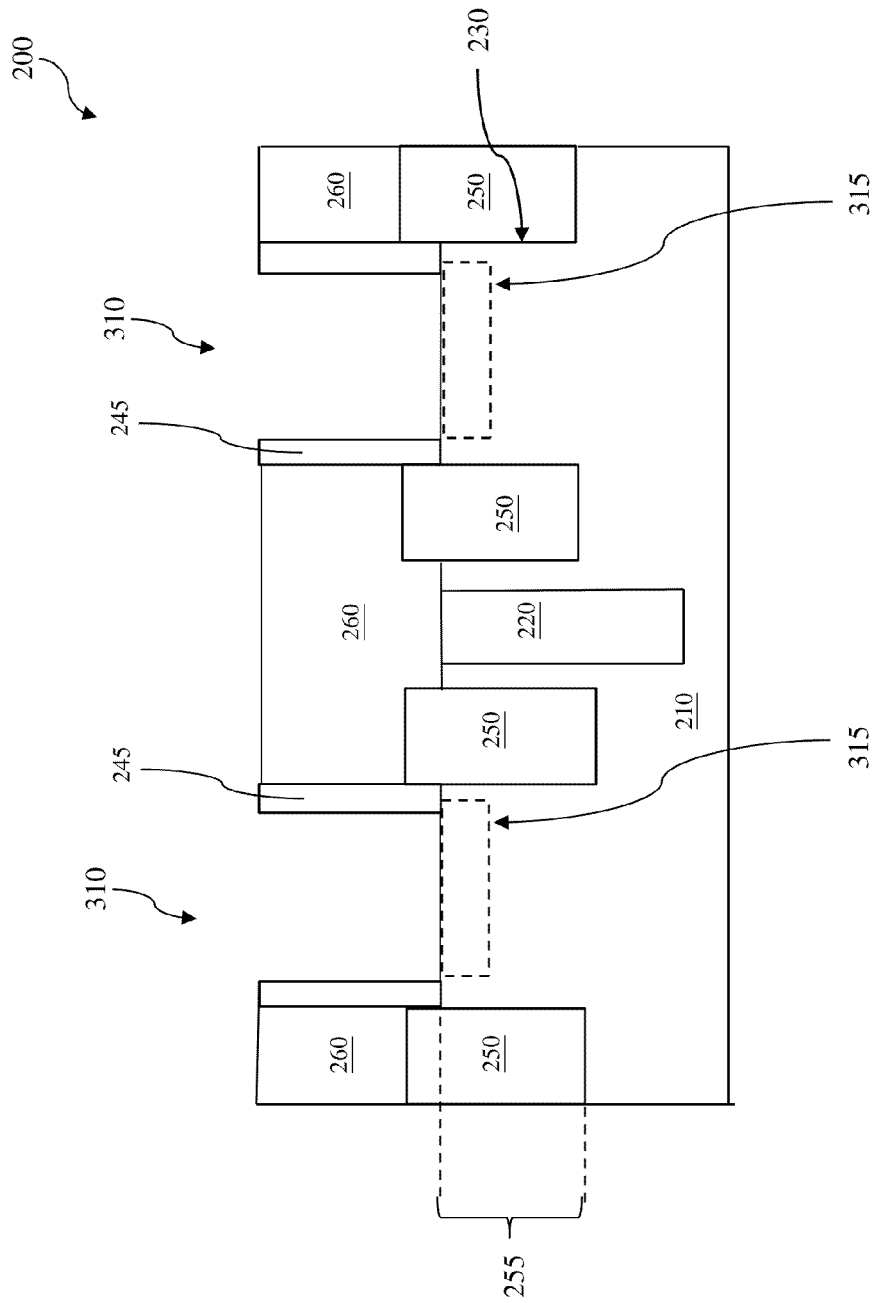

METHOD OF FORMING SEMICONDUCTOR DEVICE WITH DIFFERENT THRESHOLD VOLTAGES

BACKGROUND

The semiconductor integrated circuit (IC) industry has experienced rapid growth. Technological advances in IC design and material have produced generations of ICs where each generation has smaller and more complex circuits than previous generations. In the course of IC evolution, functional density (i.e., the number of interconnected devices per chip area) has generally increased while geometry size (i.e., the smallest component (or line) that can be created using a fabrication process) has decreased.

This scaling down process generally provides benefits by increasing production efficiency and lowering associated costs. Such scaling down has also increased the complexity of IC processing and manufacturing. For these advances to be realized, similar developments in IC processing and manufacturing are needed. Although existing methods of fabricating IC devices have been generally adequate for their intended purposes, they have not been entirely satisfactory in all respects. For example, challenges rise to develop robust formation processes for forming different threshold voltages.

BRIEF DESCRIPTION OF THE DRAWINGS

Aspects of the present disclosure are best understood from the following detailed description when read in association with the accompanying figures. It is noted that, in accordance with the standard practice in the industry, various features in drawings are not drawn to scale. In fact, the dimensions of illustrated features may be arbitrarily increased or decreased for clarity of discussion.

FIGS. 3 to 8 are cross-sectional views of an example semiconductor device in accordance with some embodiments, along the line A-A in FIG. 2A.

DETAILED DESCRIPTION

Figure 1:
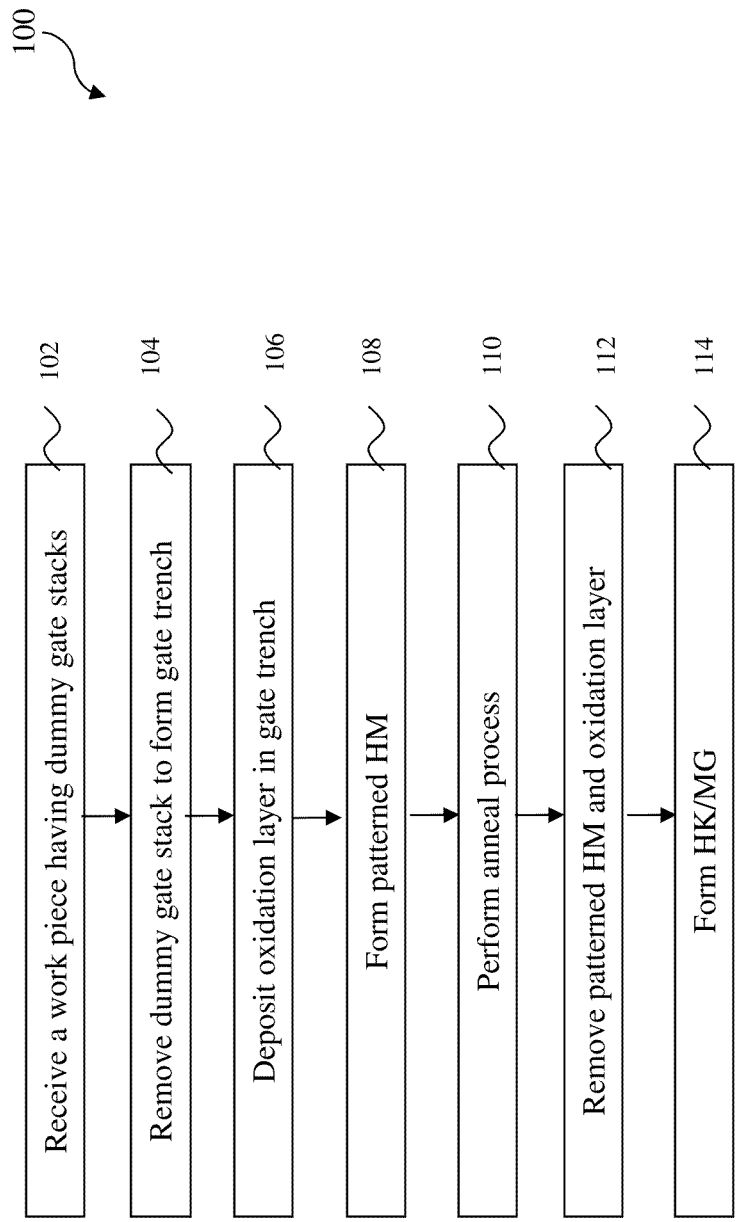
FIG. 1 is a flowchart of an example method for fabricating a semiconductor device constructed in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is directed to, but not otherwise limited to, a fin-like field-effect transistor (FinFET) device. The FinFET device, for example, may be a complementary metal-oxide-semiconductor (CMOS) device including a P-type metal-oxide-semiconductor (PMOS) FinFET device and an N-type metal-oxide-semiconductor (NMOS) FinFET device. The following disclosure will continue with a FinFET example to illustrate various embodiments of the present invention. It is understood, however, that the application should not be limited to a particular type of device, except as specifically claimed.

FIG. 1 is a flowchart of a method 100 of fabricating one or more semiconductor devices in accordance with some embodiments. The method 100 is discussed in detail below, with reference to a semiconductor device 200, shown in FIGS. 2A and 2B-8.

Figure 2A:
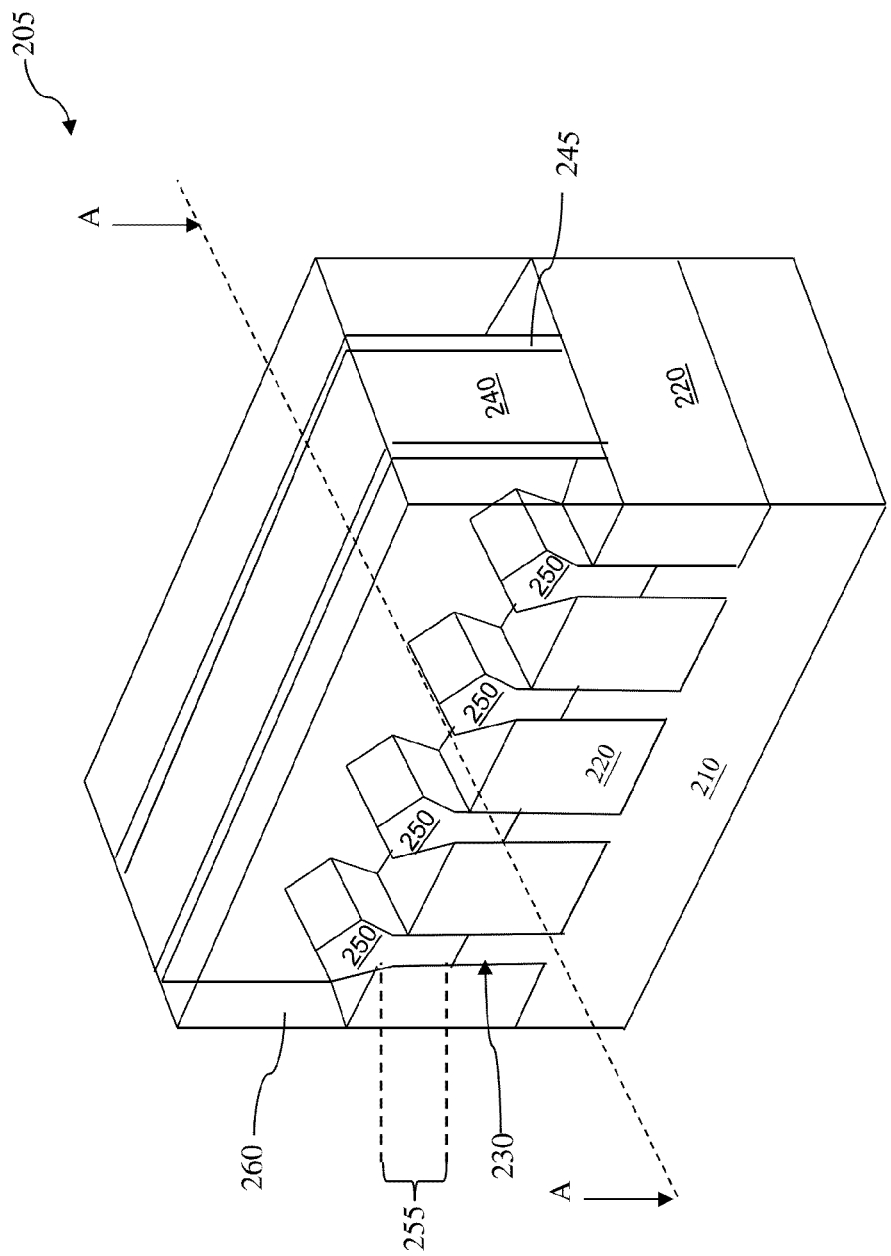
FIG. 2A is a diagrammatic perspective view of an example of a work piece of a semiconductor device in accordance with some embodiments.
Figure 2B:
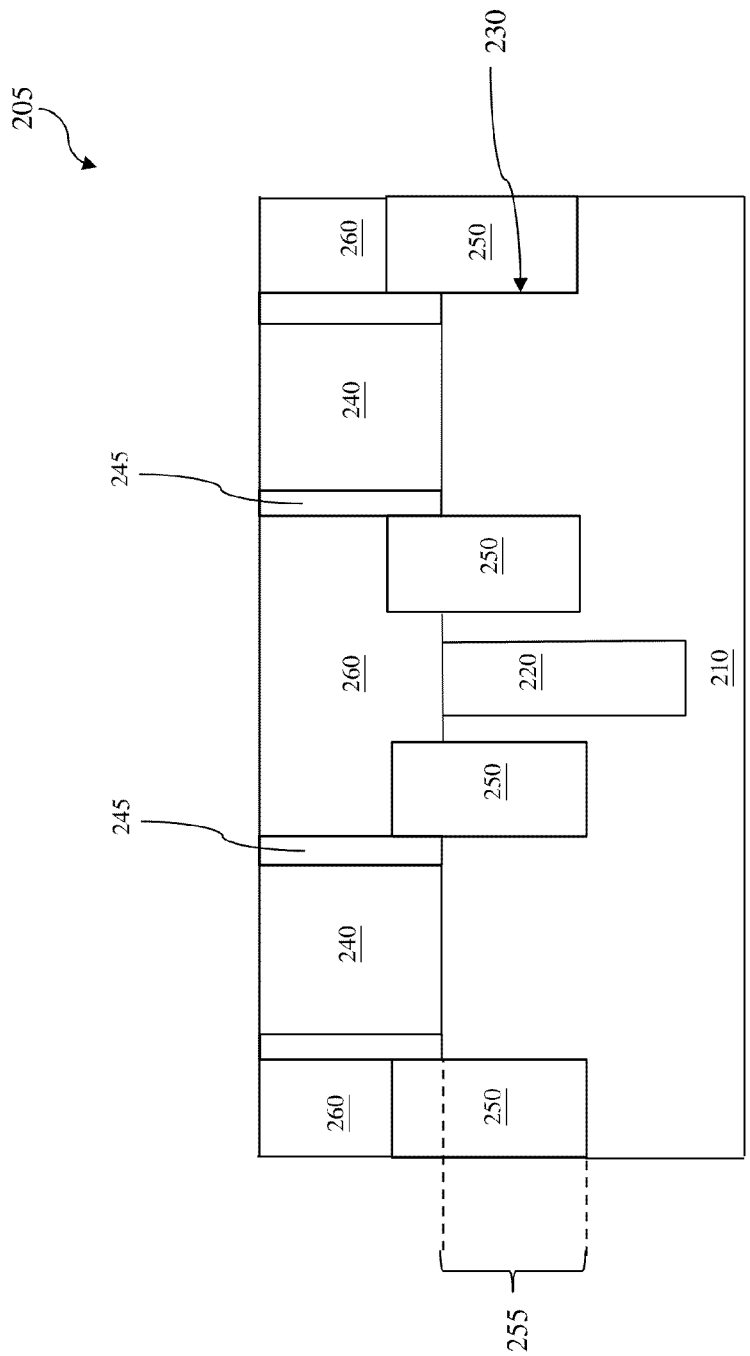
FIG. 2B is a cross-sectional view of an example of a work piece of a semiconductor device along the line A-A in FIG. 2A.

Referring to FIGS. 1, 2A and 2B, the method 100 starts at step 102 by receiving a work piece 205 of the semiconductor device 200. The work piece 205 includes a substrate 210. The substrate 210 may be a bulk silicon substrate. Alternatively, the substrate 210 may comprise an elementary semiconductor, such as silicon (Si) or germanium (Ge) in a crystalline structure; a compound semiconductor, such as silicon germanium (SiGe), silicon carbide (SiC), gallium arsenic (GaAs), gallium phosphide (GaP), indium phosphide (InP), indium arsenide (InAs), and/or indium antimonide (InSb); or combinations thereof. Possible substrates 210 also include a silicon-on-insulator (SOI) substrate. SOI substrates are fabricated using separation by implantation of oxygen (SIMOX), wafer bonding, and/or other suitable methods.

Some exemplary substrates 210 also include an insulator layer. The insulator layer comprises any suitable material, including silicon oxide, sapphire, and/or combinations thereof. An exemplary insulator layer may be a buried oxide layer (BOX). The insulator is formed by any suitable process, such as implantation (e.g., SIMOX), oxidation, deposition, and/or other suitable process. In some exemplary semiconductor device 200, the insulator layer is a component (e.g., layer) of a silicon-on-insulator substrate.

The substrate 210 may also include various doped regions. The doped regions may be doped with p-type dopants, such as boron or $BF_2$; n-type dopants, such as phosphorus or arsenic; or combinations thereof. The doped regions may be formed directly on the substrate 210, in a P-well structure, in an N-well structure, in a dual-well structure, or using a raised structure. The substrate 210 may further include various active regions, such as regions configured for an N-type metal-oxide-semiconductor transistor device and regions configured for a P-type metal-oxide-semiconductor transistor device.

The substrate 210 may also include various isolation features 220. The isolation features 220 separate various device regions in the substrate 210. The isolation features 220 include different structures formed by using different processing technologies. For example, the isolation features 220 may include shallow trench isolation (STI) features. The formation of a STI may include etching a trench in the substrate 210 and filling in the trench with insulator materials such as silicon oxide, silicon nitride, or silicon oxynitride. The filled trench may have a multi-layer structure such as a thermal oxide liner layer with silicon nitride filling the trench. A chemical mechanical polishing (CMP) may be performed to polish back excessive insulator materials and planarize the top surface of the isolation features 220.

The work piece 205 also includes a plurality of fin features 230 formed over the substrate 210. The fin feature 230 may include Si, SiGe, silicon germanium tin (SiGeSn), GaAs, InAs, InP, or other suitable materials. In some embodiments, the fin feature 230 is formed by any suitable process including various deposition, photolithography, and/or etching processes. As an example, the fin 230 is formed by patterning and etching a portion of the substrate 210.

The work piece 205 also includes a plurality of gate stacks 240 over the substrate 210, including wrapping over a portion of the fin features 230. In the present embodiment, the gate stack 240 is a dummy gate stack, which will be replaced later by high-k/metal gate (HK/MG). The dummy gate stack 240 may include a dielectric layer, a polysilicon layer. The dummy gate stack 240 may be formed by any suitable process or processes, such as deposition, patterning and etching.

Sidewall spacers 245 are formed along the sidewalls of the dummy gate stack 240. The sidewall spacers 245 may include a dielectric material such as silicon oxide. Alternatively, the sidewall spacers 245 may include silicon nitride, silicon carbide, silicon oxynitride, or combinations thereof. The sidewall spacers 245 may be formed by depositing a gate sidewall spacer layer and then anisotropic dry etching the gate sidewall spacer layer, known in the art.

The work piece 205 also includes source/drain (S/D) features 250 over the substrate 210, beside the gate stack 240 (with the sidewall spacers 245). In some embodiments, the source/drain feature 250 is a source feature, and another source/drain feature 250 is a drain feature. The source/drain features 250 are separated by the dummy gate stack 240. In one embodiment, a portion of the fin feature 230, beside the dummy gate stack 240 is recessed to form S/D recesses 255 and then the S/D features 250 are formed over the S/D recesses 255 by epitaxial growing processes, including chemical vapor deposition (CVD) deposition techniques (e.g., vapor-phase epitaxy (VPE) and/or ultra-high vacuum CVD (UHV-CVD)), molecular beam epitaxy, and/or other suitable processes. The S/D features 250 may include Ge, Si, GaAs, aluminum gallium arsenide (AlGaAs), SiGe, gallium arsenide phosphide (GaAsP), GaSb, InSb, indium gallium arsenide (InGaAs), InAs, or other suitable materials. After the S/D recesses 255 are filled with the S/D feature 250, further epitaxial growth of a top layer of the S/D features 250 expands horizontally and facets may start to form, such as a diamond shape facets. The S/D features 250 may be in-situ doped during the epi processes. For example, in one embodiment, the S/D feature 250 includes an epitaxially grown SiGe layer that is doped with boron. In another embodiment, the S/D feature 250 includes an epitaxially grown Si epi layer that is doped with carbon. In yet another embodiment, the S/D feature 250 includes an epitaxially grown Si epi layer that is doped with phosphorous. In one embodiment, the S/D feature 250 is not in-situ doped, an implantation process (i.e., a junction implant process) is performed to dope the S/D feature 250. One or more annealing processes may be performed to activate dopants. The annealing processes comprise rapid thermal annealing (RTA) and/or laser annealing processes.

The work piece 205 also includes an interlayer dielectric (ILD) layer 260 deposited over the substrate 210, including between/over each of the dummy gate stack 240 and over the S/D features 250. The ILD layer 260 may be deposited by CVD, atomic layer deposition (ALD), spin-on coating, or other suitable techniques. The ILD layer 260 may include silicon oxide, silicon nitride, oxynitride, a dielectric material having a dielectric constant (k) lower than thermal silicon oxide (therefore referred to as low-k dielectric material layer), and/or other suitable dielectric material layer. The ILD layer 260 may include a single layer or multiple layers. A CMP may be performed to polish back the ILD layer 260 to expose a top surface of the dummy gate stack 240.

Referring to FIGS. 1 and 3, the method of 100 proceeds to step 104 by removing the dummy gate stacks 240 to form gate trenches 310. The etching processes may include selective wet etch or selective dry etch, such that having an adequate etch selectivity with respect to the fin feature 230, the sidewall spacer 245 and the ILD layer 260. Alternatively, the dummy gate stacks 240 may be removed by a series of processes including photolithography patterning and etching back. In the present embodiment, a portion of the fin features 230 is exposed in the gate trenches 310, where a gate channel is to be formed and therefore it is referred to as a channel region 315.

Figure 4:
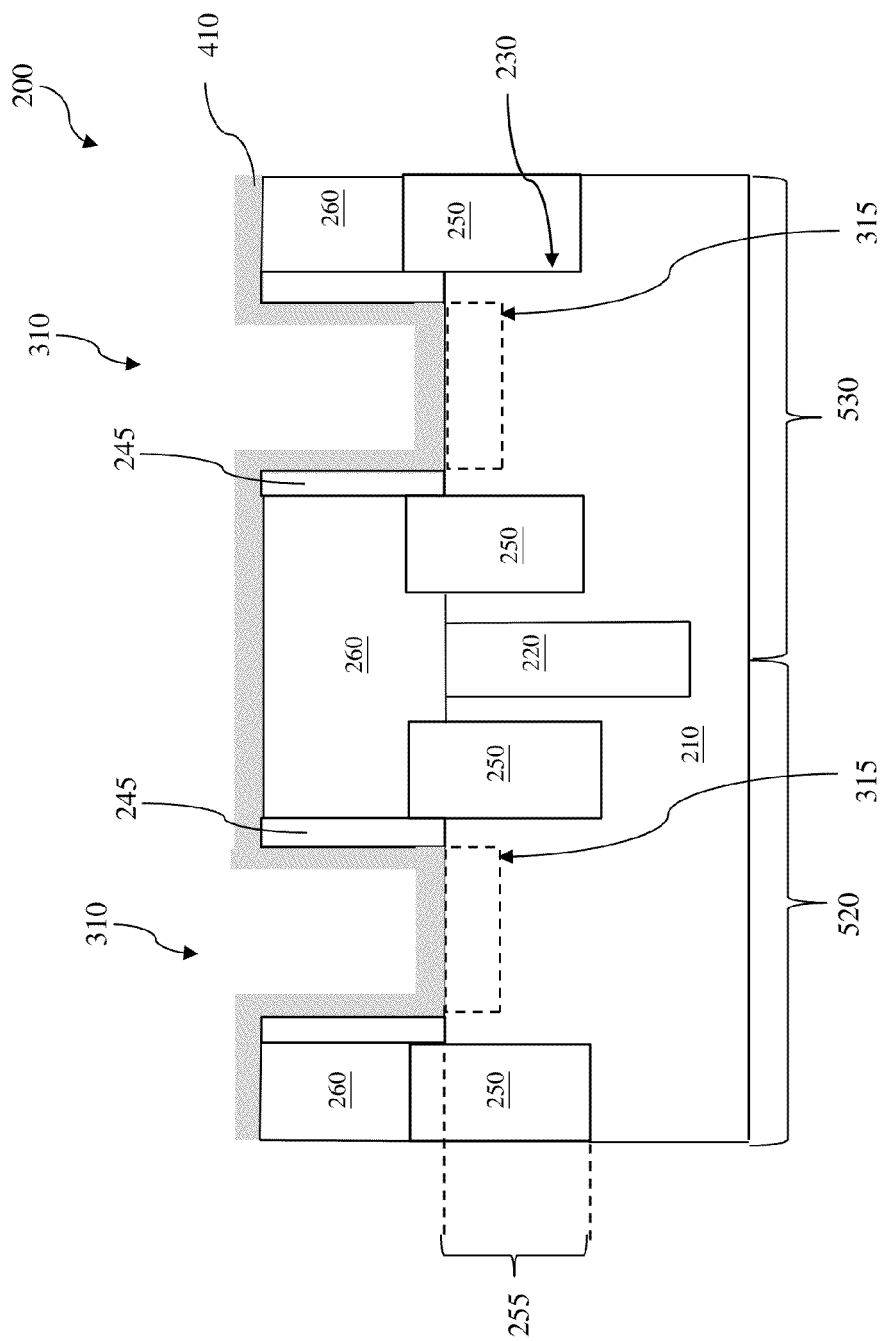

Referring to FIGS. 1 and 4, the method 100 proceeds to step 106 by depositing an oxidation layer 410 in gate trenches 310. In the present embodiment, the oxidation layer 410 deposited over the substrate 210, including over the channel region 315 in the gate trenches 310. As shown, the oxidation layer 410 physically contacts the channel region 315. The oxidation layer 410 may include silicon, silicon oxide, silicon oxynitride, or other suitable materials. The oxidation layer 410 may be deposited by CVD, ALD, or other suitable techniques.

Figure 5:
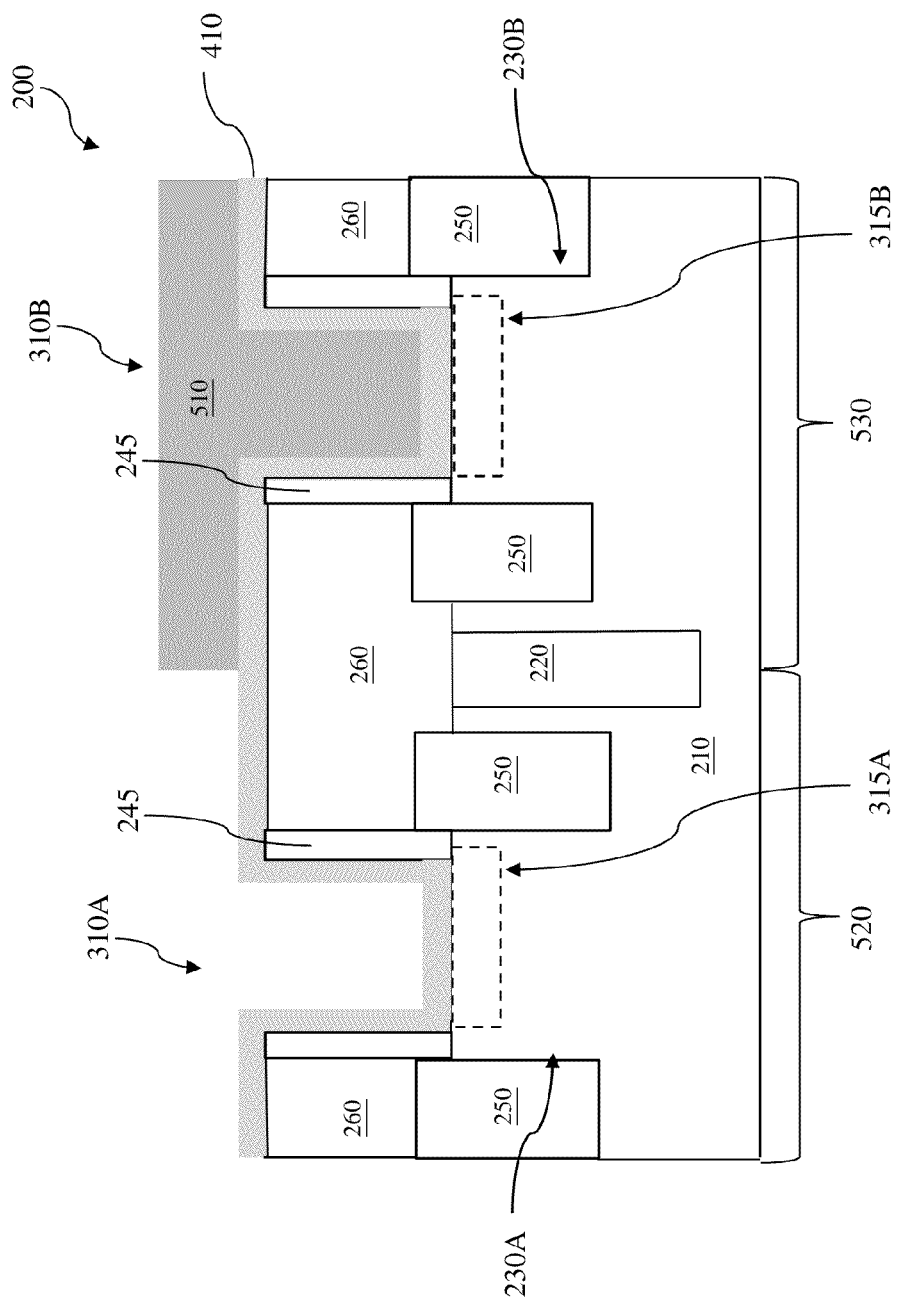

Referring to FIGS. 1 and 5, the method 100 proceeds to step 108 by forming a patterned hard mask (HM) 510 to define a first region 520 and a second region 530 over the substrate 210. It is often desirable to be able to make semiconductor device with different threshold voltages (Vt). For example, the first region 520 is a low-power portion (having high $V_{th}$) and the second region 530 is a high-speed portion (having low $V_{th}$). For another example, the first region 520 is an n-type FinFET (NFET) region and the second region 530 is a p-type FinFET (PFET) region. Therefore a first HK/MG gate to be formed in the NFET region 520 may need to have a different gate threshold voltage (Vt) from a second HK/MG gate to be formed in the PFET region 530. In the present embodiment, the patterned HM 510 covers the second region 530 and leave the first region 520 uncovered. The patterned HM 510 may include silicon nitride, silicon carbide, silicon carbide nitride, and/or other suitable material. It should be understood that in other embodiments the first region 520 is a p-type FinFET (NFET) region and the second region 530 is an n-type FinFET (PFET) region.

In some embodiments, the patterned HM 510 is formed by depositing a HM layer over both of the first region 530 and the second region 530 first. The material of the HM layer is chosen to be different from the material of the oxidation layer 410 to achieve etching selectivity during a subsequent etch as will be described in further detail below. For example, the HM layer includes silicon nitride while the oxidation layer 410 includes silicon oxide. The HM layer may be deposited by CVD, ALD, or other suitable techniques. A patterned photoresist layer is formed over the HM layer by a lithography process and the HM layer is then etched through the patterned photoresist layer. The etching process selectively etches HM layer but substantially does not etch the oxidation layer 410. The selective etch may include a selective wet etch, a selective dry etch, and/or a combination thereof.

For the sake of clarity, the gate trench 310, the fin feature 230 and the channel region 315 in the first region 520 is referred to as a first gate trench 310A, the first fin feature 230A and the first channel region 315A, respectively, and the gate trench 310, the fin feature 230 and the channel region 315 in the second region 530 is referred to as a first gate trench 310B, the first fin feature 230B and the first channel region 315B, respectively. Being uncovered by the patterned HM 510, the oxidation layer 410 in the first gate trench 310A is exposed.

Figure 6:
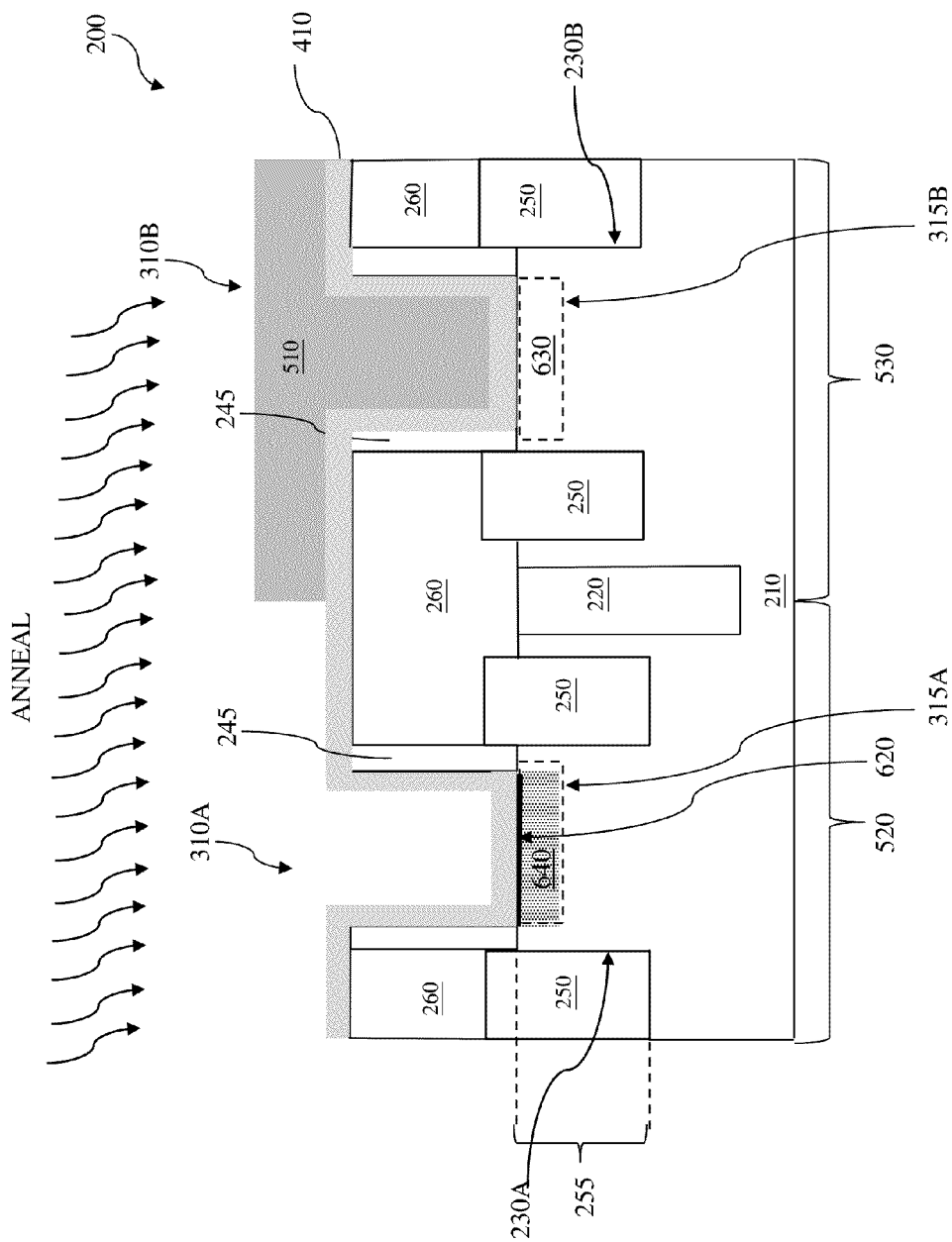

Referring to FIGS. 1 and 6, the method 100 proceeds to step 110 by performing an annealing process to change material composition in the first channel region 315A. In the present embodiment, the channel region 315A is in different environments from the channel region 315B. Particularly, the oxidation layer 410 covering the first channel region 315A is uncovered by the patterned HM 510 while the oxidation layer 410 covering the second channel region 315B is covered by the patterned HM 510. With the differentiated conditions to the first and second channel regions, 315A and 315B, the annealing process is designed to change material composition of the first channel region 315A while the second channel region 315B remains unchanged. The changing of the material composition of the first channel region 315A experiences a self-alignment nature, which improves process control window.

During the annealing process, the semiconductor material of an upper portion (adjacent to the exposed oxidation layer 410) of the first channel region 315A converts to semiconductor oxide layer 620 (which will be removed later) and the semiconductor material of a lower portion of the first channel region 315A changes its composition from a first composition 630 to a second composition 640. In some embodiments, the semiconductor oxide layer 620 is different than the oxidation layer 410. Therefore, after the annealing process (and removing the semiconductor oxide layer 620), the semiconductor material in the first channel region 315A has the second composition 640 while the semiconductor material in the second channel region 315B has the first composition 630.

In one embodiment, the semiconductor material of the first channel region 315A includes SiGe and the oxidation layer 410 is a silicon oxide layer. During the annealing process, an upper portion of the SiGe (which contacts the oxidation layer 410) in the first channel region 315A converts to a silicon germanium oxide (SiGeO) layer 620, a silicon oxide layer 620, or a GeO layer 620, (which will be removed later). The lower portion of the first channel region 315A changes from the first composition $SiGx_1$ 630, where $x_1$ is Ge composition in atomic percent, to the second composition $SiGex_2$ 640, where $x_2$ is Ge composition in atomic percent. Here $x_2$ is different from $x_1$ (e.g. $x_1$ is about 50% while $x_2$ is about 70%). The Ge composition $x_2$ may vary with process conditions, such as anneal temperature, pressure and time. As an example, the anneal temperature is in a temperature ranging from about 400° C. to about 1000° C. and under a pressure ranging from about 1 atm. to about 20 atm.

Figure 7:
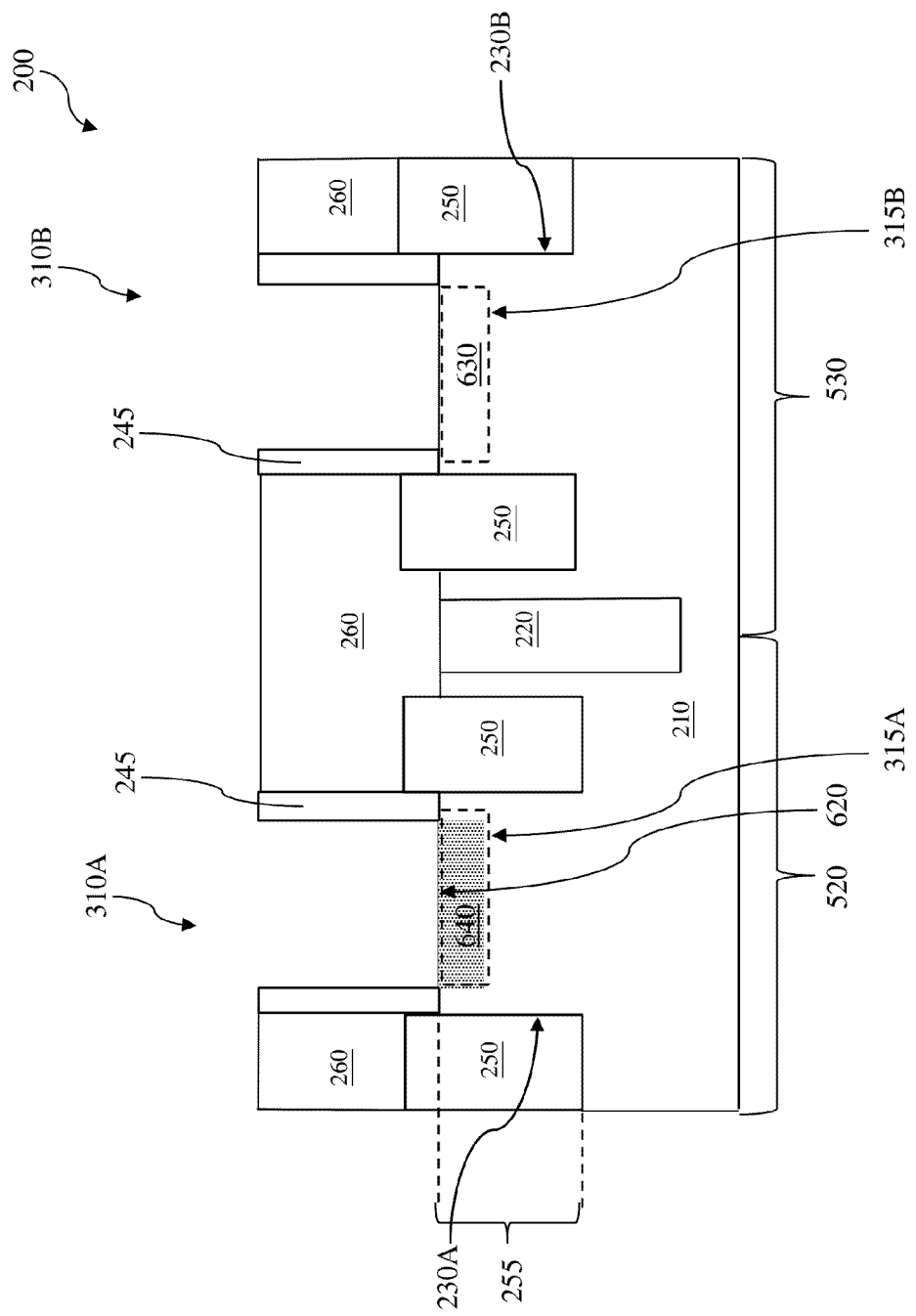

Referring to FIGS. 1 and 7, the method 100 proceeds to step 112 by removing the patterned HM 510, the oxidation layer 410 and the semiconductor oxide layer 620. The etching process may include wet etch, dry etch, and/or a combination thereof. The etching process may include a multiple sub-etching processes to achieve an adequate etch selectivity and process flexibility.

Figure 8:
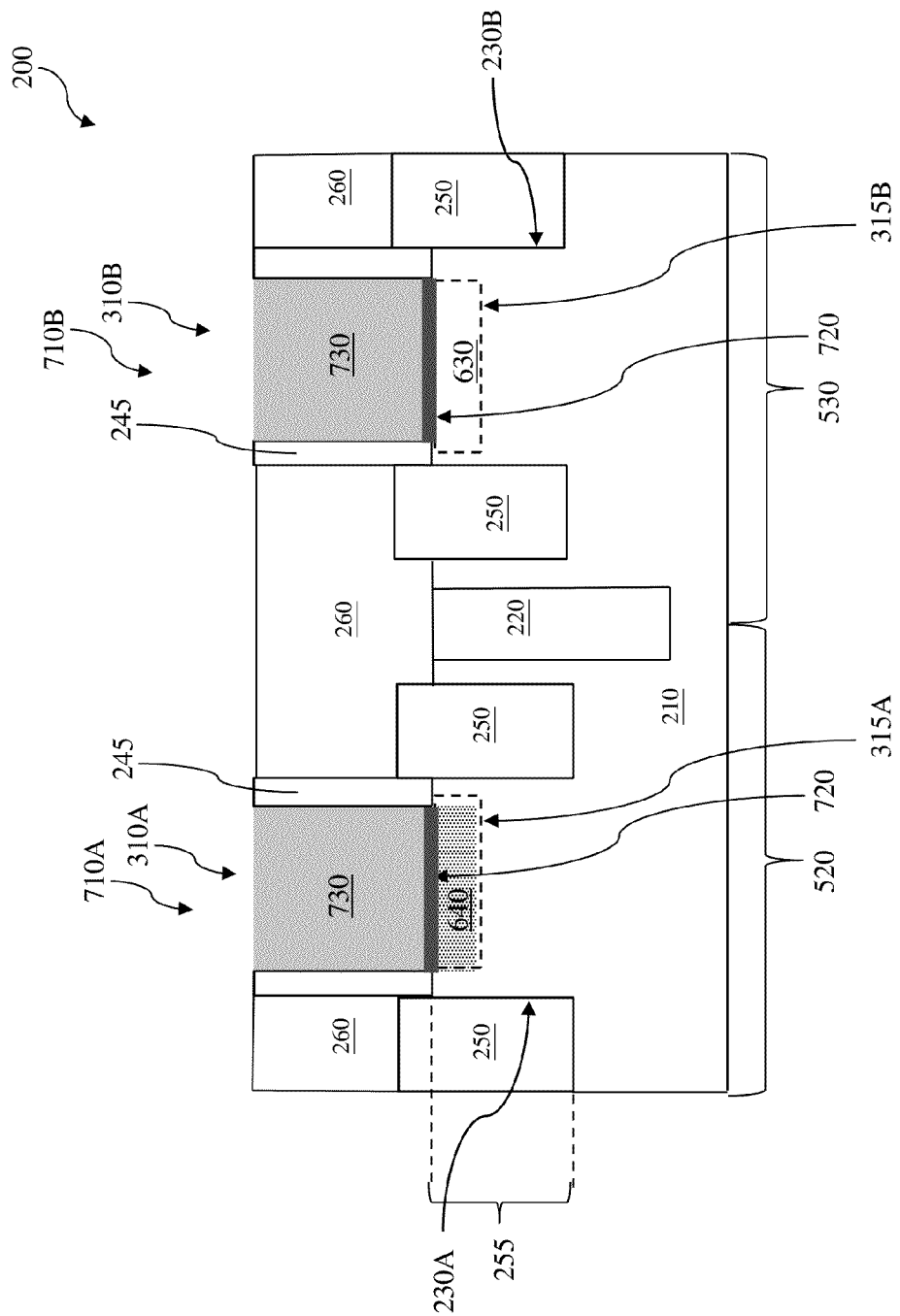

Referring to FIGS. 1 and 8, the method 100 proceeds to step 114 by forming HK/MG 710 in the first region 520 and the second region 530, including wrapping over the first fin feature 230A and the second fin feature 230B, respectively. For the sake of clarity to better description, the HK/MG 710 in the first region 520 is referred to as the first HK/MG 710A and the HK/MG 710 in the second region 530 is referred to as the second HK/MG 710B.

The first and second HK/MGs, 710A and 710B, include gate dielectric layer 720 and MG electrode 730 over the gate dielectric layer 720. In one embodiment, the gate dielectric layer 720 includes a dielectric material layer having a high dielectric constant (HK dielectric layer-greater than that of the thermal silicon oxide in the present embodiment) and the gate electrode 730 includes metal, metal alloy or metal silicide. The formation of the first and second HK/MGs, 710A and 710B, includes depositions to form various gate materials and a CMP process to remove the excessive gate materials and planarize the top surface of the semiconductor structure 200.

In one embodiment, the gate dielectric layer 720 includes an interfacial layer deposited by a suitable method, such as atomic layer deposition (ALD), CVD, thermal oxidation or ozone oxidation. The IL may include oxide, HfSiO and oxynitride. A HK dielectric layer is deposited on the IL by a suitable technique, such as ALD, CVD, metal-organic CVD (MOCVD), physical vapor deposition (PVD), other suitable technique, or a combination thereof. The HK dielectric layer may include LaO, AlO, ZrO, TiO, Ta2O5, Y2O3, SrTiO3 (STO), BaTiO3 (BTO), BaZrO, HfZrO, HfLaO, HfSiO, LaSiO, AlSiO, HfTaO, HfTiO, (Ba,Sr)TiO3 (BST), Al2O3, Si3N4, oxynitrides (SiON), or other suitable materials.

The MG electrode 730 may include a single layer or alternatively a multi-layer structure, such as various combinations of a liner layer, wetting layer, adhesion layer and a conductive layer of metal, metal alloy or metal silicide. The MG electrode 730 may include Ti, Ag, Al, TiAlN, TaC, TaCN, TaSiN, Mn, Zr, TiN, TaN, Ru, Mo, Al, WN, Cu, W, any suitable materials or a combination thereof. The MG electrode 730 may be formed by ALD, PVD, CVD, or other suitable process. In some embodiments, the MG electrode 730 may be formed at same time in both of the first and second regions, 520 and 530, with same metal layers. A CMP process may be performed to remove excessive MG electrode 730. The CMP process provides a substantially planar top surface for the MG electrode 730 and the ILD layer 260.

In the present embodiment, the first HK/MG 710A is formed over the first channel region 315A, which has the second composition 640, and the second HK/MG 710B is formed over the second channel region 315B, which has the first composition 630. Thus the first HK/MG 710A has a different threshold voltages Vt than the second HK/MG 710B. In the present embodiment, by choosing the first composition 630 of the fin feature 230, the oxidation layer 240 and the annealing process conditions, two different target threshold voltages Vt for the first and second HK/MG, 710A and 710B, are achieved.

In some embodiments, the first HK/MG 710A and the second HK/MG 710B are formed simultaneously and have same gate dielectric layer 720 and the MG electrode 730. With the first and second compositions, 630 and 640, of the first and second channel regions, 310A and 310B, the first HK/MG 710A has a different threshold voltage Vt from the second HK/Mg 720. It proves process simplicity and flexibility for forming different threshold voltage Vt.

Additional steps can be provided before, during, and after the method 100, and some of the steps described can be replaced, eliminated, or moved around for additional embodiments of the method 100.

Figure 9:
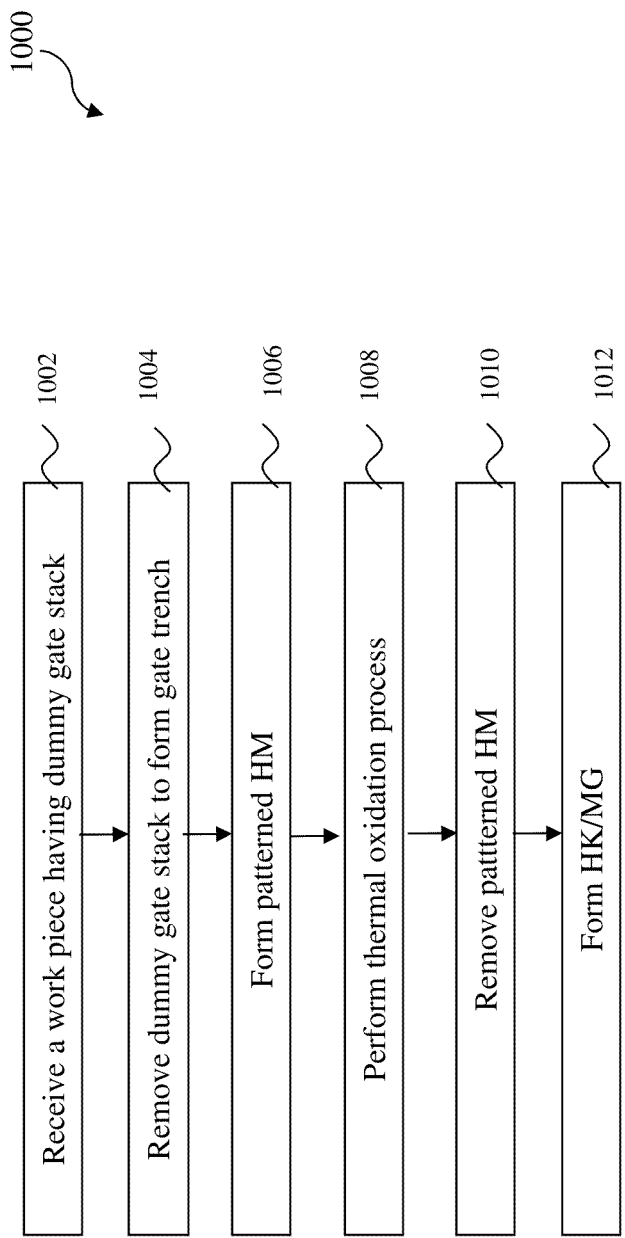
FIG. 9 is a flow chart of an example method for fabricating a semiconductor device in accordance with some embodiments.

FIG. 9 is a flowchart of another method 1000 for fabricating the semiconductor device 200. The first two steps, 1002 and 1004, are similar to those discussed above in steps 102 and 104, respectively. Thus, the discussion above with respect to steps 102 and 104 is applicable to the steps 1002 and 1004, respectively. The present disclosure repeats reference numerals and/or letters in the various embodiments. This repetition is for the purpose of simplicity and clarity such that repeated reference numerals and/or letters indicate similar features amongst the various embodiments unless stated otherwise.

Figure 10:
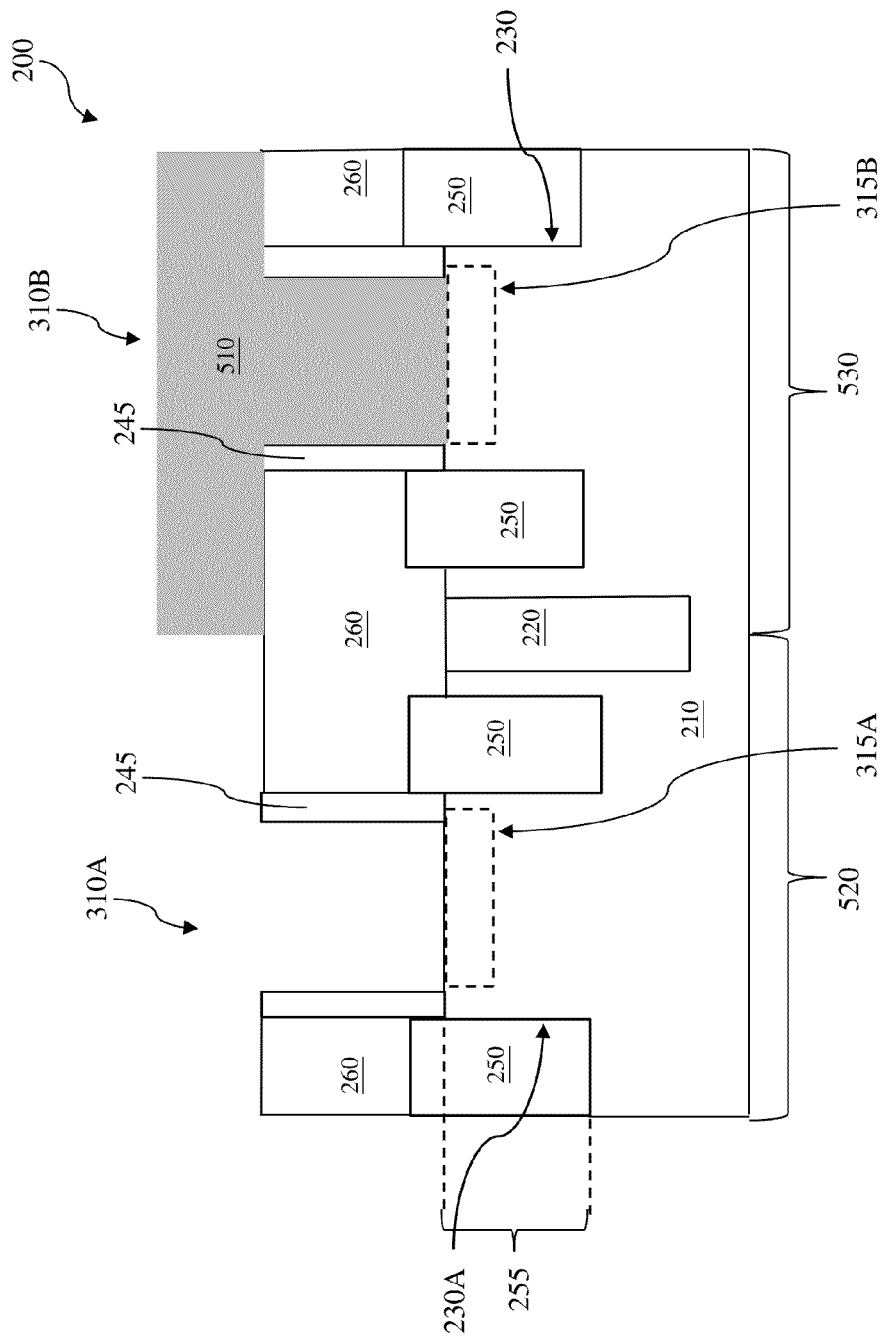
FIGS. 10 and 11 are cross-sectional views of an example semiconductor device along the line A-A in FIG. 2A, in accordance with some embodiments.

Referring to FIGS. 9 and 10, after removing the dummy gate stack 240 and forming the first gate trench 310A and the second gate trench 310B, the method 1000 proceeds to step 1006 by forming the patterned HM 510 to cover the second gate trench 310B and leave the first gate trench 310A be uncovered. The formation of the patterned HM 510 is similarly in many respects to those discussed above in association with FIG. 3.

Figure 11:
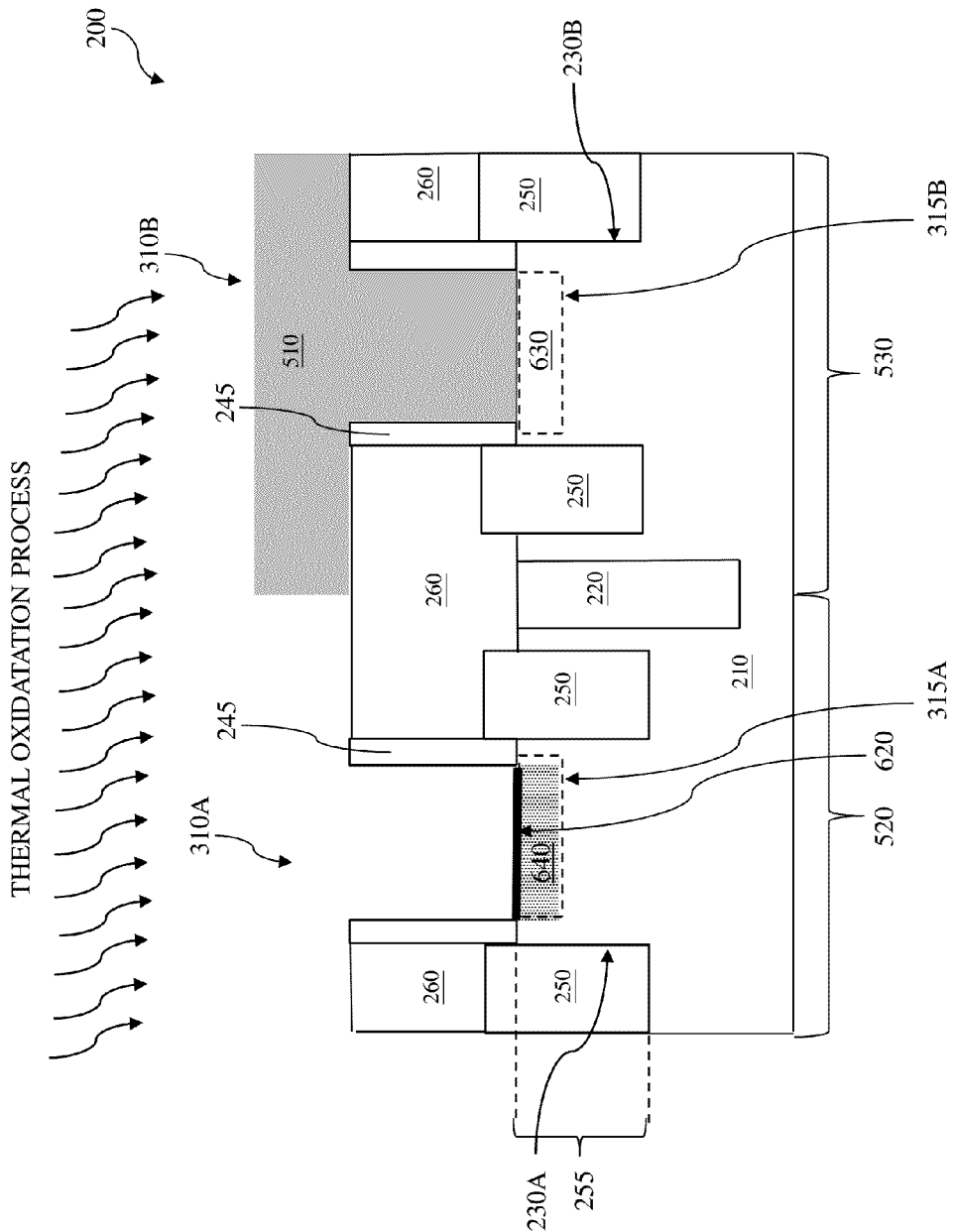

Referring to FIGS. 9 and 11, the method 1000 proceeds to step 1008 by performing a thermal oxidation process to change material composition of the first channel region 315A. In one embodiment, the thermal oxidation process is conducted in oxygen ambient. In another embodiment, the thermal oxidation process is conducted in a combination of steam ambient and oxygen ambient.

In the present embodiment, the first channel region 315A is in different environments from the second channel region 315B. Particularly, the first channel 315A is exposed and the second channel 315B is covered by the patterned HM 510. With the differentiated conditions to the first channel region 315A and the second channel region 315B, the thermal oxidation process is designed to change material composition of the first channel region 315A while the second channel region 315B remains unchanged.

During the thermal oxidation process, the semiconductor material of the first channel region 315A interacts with oxygen provided by the thermal oxidation process and an upper portion (adjacent to the exposed oxidation layer 240) converts to semiconductor oxide layer 620 (which will be removed later) and the semiconductor material of a lower portion of the first channel region 315A changes its composition from a first composition 630 to a second composition 640. Therefore, the semiconductor material in the first channel region 315A has the second composition 640 while the semiconductor material in the second channel region 315B has the first composition 630. The changing of the material composition of the first channel region 315A experiences a self-alignment nature, which improves process control window.

In one embodiment, the semiconductor material of the first channel region 315A includes SiGe. During the thermal oxidation process, the SiGe in the first channel region 315A interacts with oxygen provided by the thermal oxidation process and a silicon oxide layer (which will be removed later) is formed in the upper portion of the first channel region 315A. Due to silicon oxide formation, a composition of the lower portion of the first channel region 315A changes from the first composition $SiGx_1$ 630, (where $x_1$ is Ge composition in atomic percent), to the second composition $SiGex_2$ 640, (where $x_2$ is Ge composition in atomic percent) and $x_2$ is higher than $x_1$. The Ge composition $x_2$ may vary with process conditions, such as thermal oxidation temperature, pressure and time.

The remaining steps of method 1000 are similar to those described above with respect to FIGS. 7 and 8. For simplicity and clarity, the remaining discussion of method 1000 refers to FIGS. 7-9. Referring to FIGS. 7 and 9, the method 1000 proceeds to step 1010 by removing the patterned HM 510 and the semiconductor oxide layer 620. The patterned HM 510 and the semiconductor oxide layer 620 are removed similarly in many respects to those discussed in step 112 of the method 100.

Referring to FIGS. 8 and 9, the method 1000 proceeds to step 1012 by forming the first and second HK/MGs 710A and 710B. The first and second HK/MGs, 710A and 710B, are formed similarly in many respects to those discussed in step 114 of the method 100. The first HK/MG 710A has a different threshold voltages Vt than the second HK/MG 710B.

Additional steps can be provided before, during, and after the method 100, and some of the steps described can be replaced, eliminated, or moved around for additional embodiments of the method 100.

Figure 12:
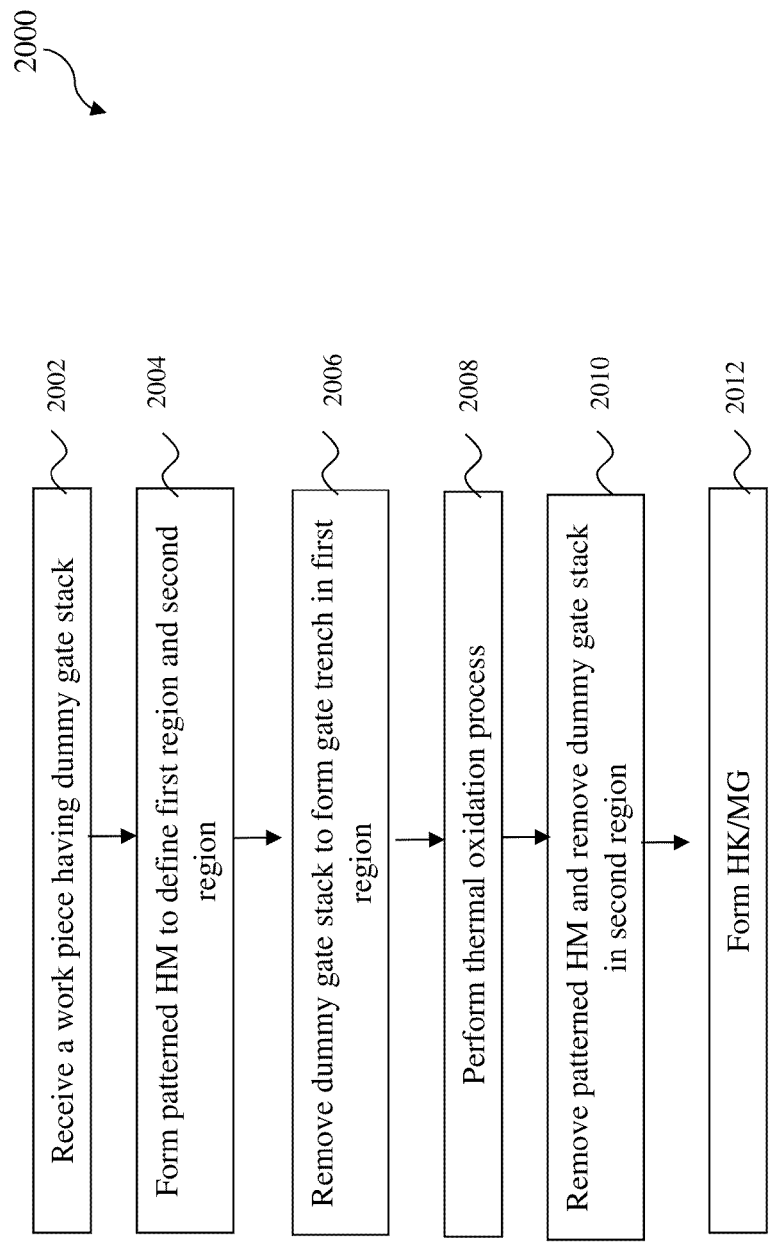
FIG. 12 is a flow chart of an example method for fabricating a semiconductor device in accordance with some embodiments.

FIG. 12 is a flowchart of another example method 2000 for fabricating the semiconductor device 200. The first step 2002 of the method 2000 is similar to step 102 of the method 100, discussed above in FIG. 1. Thus, the discussion above with respect to steps 102 is applicable to step 2002. The present disclosure repeats reference numerals and/or letters in the various embodiments. This repetition is for the purpose of simplicity and clarity such that repeated reference numerals and/or letters indicate similar features amongst the various embodiments unless stated otherwise.

Figure 13:
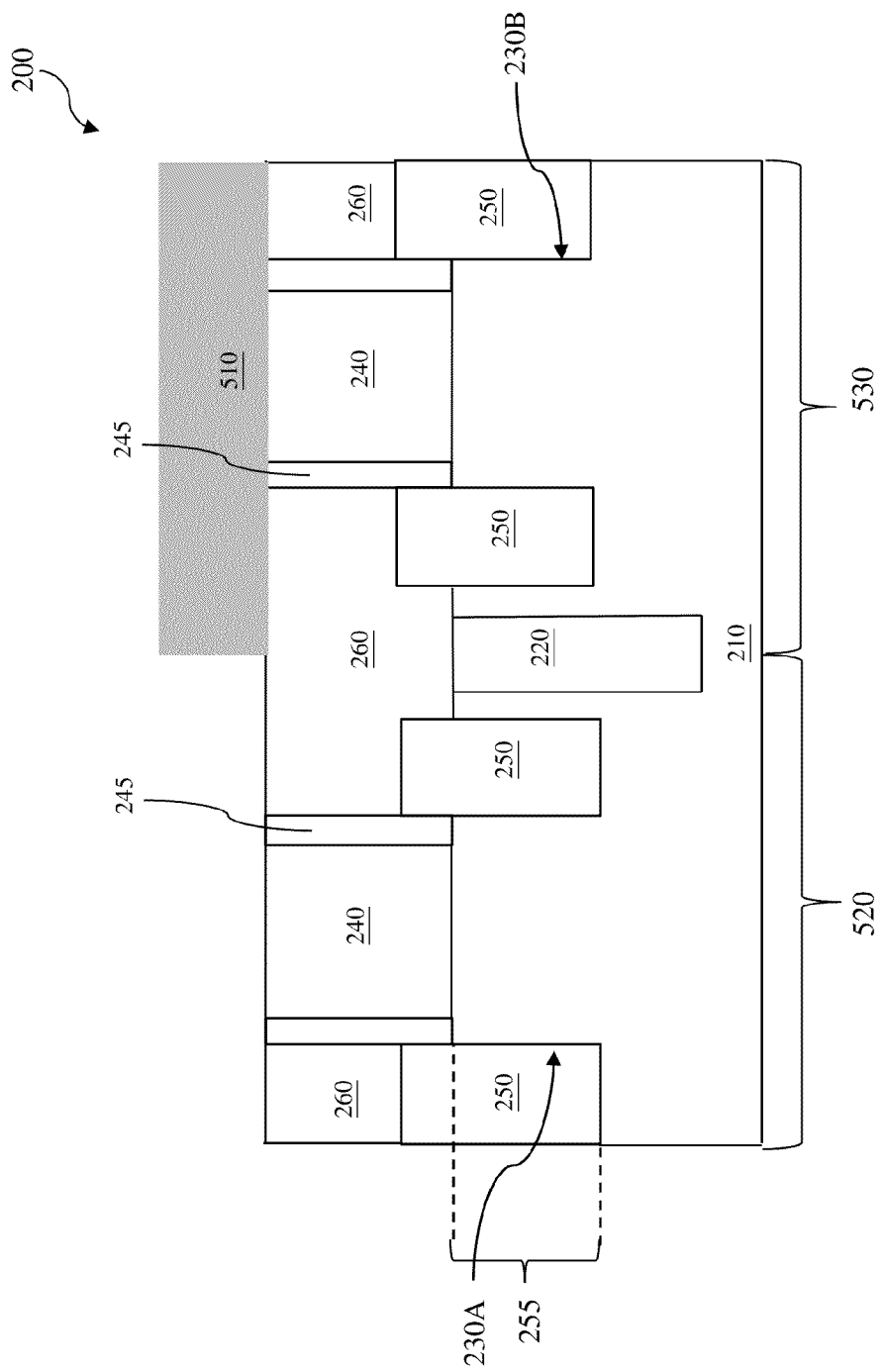
FIGS. 13-15 are cross-sectional views of an example semiconductor device in accordance with some embodiments, along the line A-A in FIG. 2A.

Referring to FIGS. 12 and 13, the method proceeds to step 2004 by forming the patterned HM 510 over the substrate 210 to define the first region 520 and the second region 530. The formation of the patterned HM 510 is similarly in many respects to those discussed above in association with FIG. 5.

Figure 14:
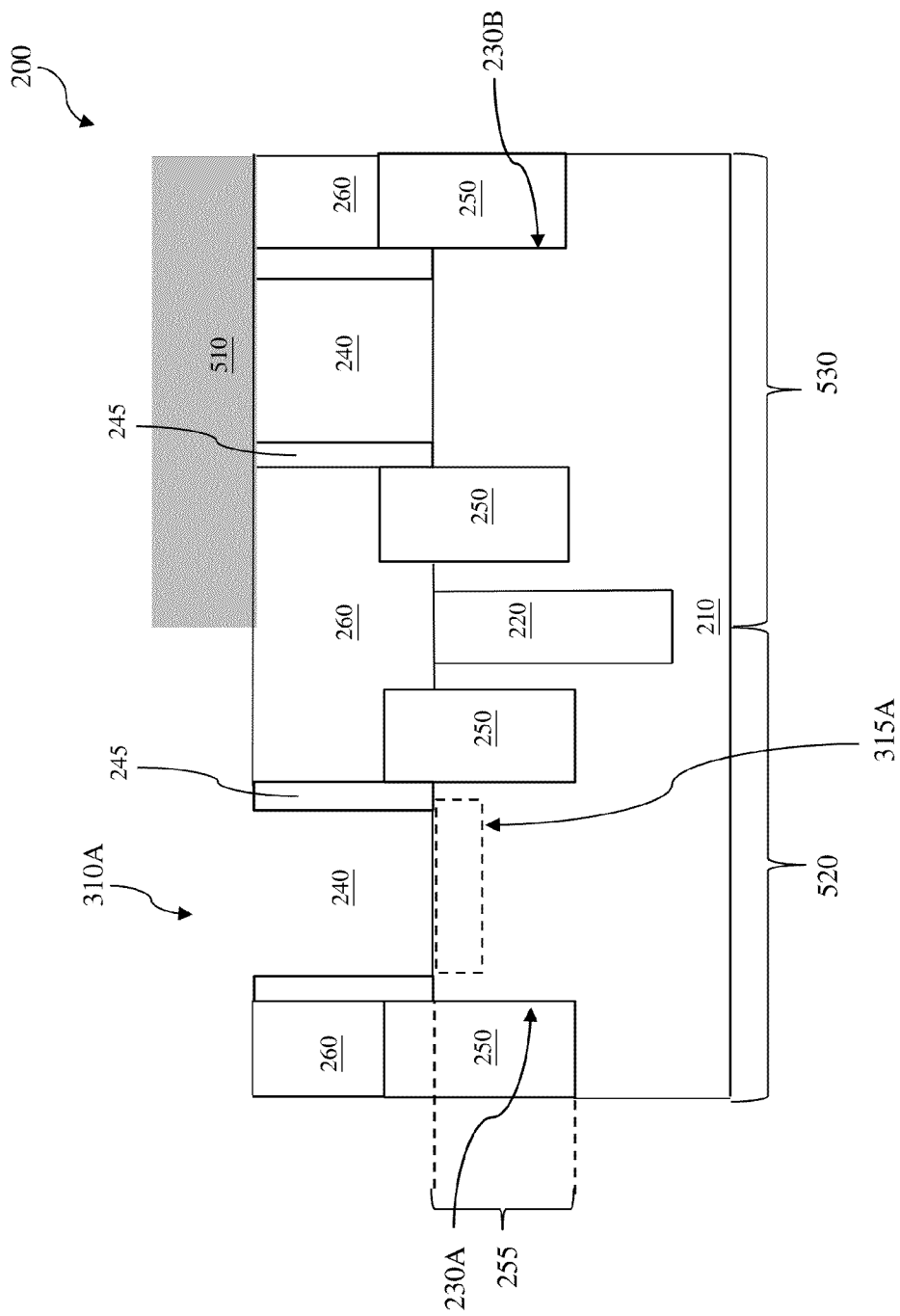

Referring to FIGS. 12 and 14, the method of 2000 proceeds to step 2006 by removing the dummy gate stack 240 and forming the first gate trench 310A in the first region 520. The removal of the dummy gate stack 240 is similarly in many respects to those discussed above in association with FIG. 3. The first channel region 315A is exposed in the first trench 310A.

Figure 15:
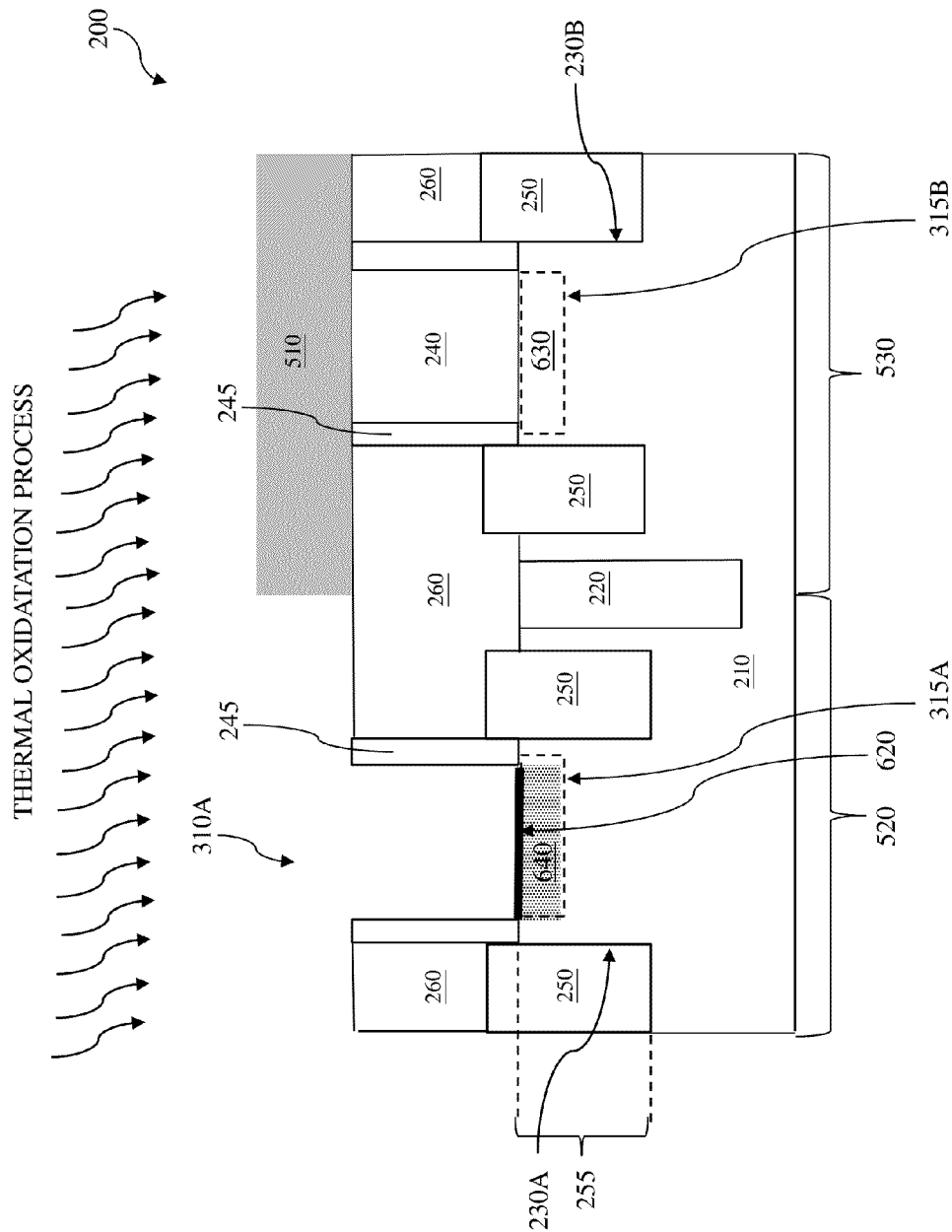

Referring to FIGS. 12 and 15, the method of 2000 proceeds to step 2008 by performing a thermal oxidation process to change material composition in the first channel region 315A. The thermal oxidation process is similarly in many respects to those discussed above in association with FIG. 11. After the thermal oxidation process, the first channel region 315A has the second composition 640 while the second channel region 315B remains the first composition 630. The changing of the material composition of the first channel region 315A experiences a self-alignment nature, which improves process control window.

The remaining steps of method 2000 are similar to those described above with respect to FIGS. 7 and 8. For simplicity and clarity, the remaining discussion of method 2000 refers to FIGS. 7, 8, and 12. Referring to FIGS. 7 and 12, the method 2000 proceeds to step 2010 by removing the patterned HM 510, the semiconductor oxide layer 620 in the first gate trench 310a and the dummy gate stack 240 in the second region 530 to form the second gate trench 310B. The etching process may include wet etch, dry etch, and/or a combination thereof. The etching process may include a multiple sub-etching processes to achieve an adequate etch selectivity and process flexibility.

Referring to FIGS. 8 and 12, the method 1000 proceeds to step 1012 by forming the first and second HK/MGs, 710A and 710B. The first and second HK/MGs, 710A and 710B, are formed similarly in many respects to those discussed in step 114 of the method 100. The first HK/MG 710A has a different threshold voltages Vt than the second HK/MG 710B.

Additional steps can be provided before, during, and after the method 2000, and some of the steps described can be replaced, eliminated, or moved around for additional embodiments of the method 2000.

The semiconductor device 200 may undergo further CMOS or MOS technology processing to form various features and regions known in the art. For example, subsequent processing may form various contacts/vias/lines and multilayers interconnect features (e.g., metal layers and interlayer dielectrics) over the substrate 210, configured to connect the various features or structures of the FinFET device 200. For example, a multilayer interconnection includes vertical interconnects, such as conventional vias or contacts, and horizontal interconnects, such as metal lines. The various interconnection features may implement various conductive materials including copper, tungsten, and/or silicide. In one example, a damascene and/or dual damascene process is used to form a copper related multilayer interconnection structure.

Based on the above, it can be seen that the present disclosure provides methods of forming different threshold voltages in a semiconductor device. Instead of performing implantation or forming different work function metal layer to adjust threshold voltage, the methods provide forming different threshold voltages by performing a thermal oxidation process to change a composition of a first channel region while leaving a second channel region intact. The composition changing in the first channel region has self-aligned nature. Thus threshold voltage adjustment is achieved without adverse impacts from an implantation process and process constrains from forming work function metal layer. The method demonstrates a robust formation process for forming different threshold voltages.

The present disclosure provides many different embodiments of fabricating a semiconductor device that provide one or more improvements over existing approaches. In one embodiment, a method for fabricating a semiconductor device includes forming a first gate stack over a first fin feature and second gate stack over a second fin feature, removing the first gate stack to form a first gate trench that exposes the first fin structure, removing the second gate stack to form a second gate trench that exposes the second fin feature, performing an annealing process to change a composition of a portion of the first fin feature and forming a first high-k/metal gate (HK/MG) within the first gate trench over the portion of the first fin feature and a second HK/MG within the second gate trench over the second fin feature. Therefore the first HK/MG is formed with a first threshold voltage and the second HK/MG is formed with a second threshold voltage, which is different than the first threshold voltage.

In yet another embodiment, a method includes forming a first gate stack over a first fin feature and second gate stack over a second fin feature, removing the first gate stack to form a first gate trench that exposes the first fin structure, removing the second gate stack to form a second gate trench that exposes the second fin feature, depositing an oxidation layer over the first gate trench, performing an annealing process to change a composition of the first portion of the first fin feature and forming a first high-k/metal gate (HK/MG) over the first portion of the fin feature and a second HK/MG over the second portion of the second fin feature. Therefore the first HK/MG is formed with a first threshold voltage and the second HK/MG is formed with a second threshold voltage, which is different than the first threshold voltage.

In yet another embodiment, a method includes forming a first gate stack over a first fin feature and second gate stack over a second fin feature, removing the first gate stack to form a first gate trench that exposes the first fin structure, removing the second gate stack to form a second gate trench that exposes the second fin feature, performing a thermal oxidation process to change a composition of a portion of the first fin feature and forming a first high-k/metal gate (HK/MG) within the first gate trench over the portion of the first fin feature and a second HK/MG within the second gate trench over the second fin feature. Therefore the first HK/MG is formed with a first threshold voltage and the second HK/MG is formed with a second threshold voltage, which is different than the first threshold voltage.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    forming a first gate stack over a first fin feature and second gate stack over a second fin feature;
    removing the first gate stack to form a first gate trench that exposes the first fin feature;
    removing the second gate stack to form a second gate trench that exposes the second fin feature;
    forming an oxidation layer in the first gate trench;
    after forming the oxidation layer, performing an annealing process to change a composition of a portion of the first fin feature, wherein performing the annealing process to change the composition of the portion of the first fin feature includes forming an oxide layer under the oxidation layer, wherein the oxidation layer is different from the oxide layer; and
    forming a first high-k/metal gate (HK/MG) within the first gate trench over the portion of the first fin feature and a second HK/MG within the second gate trench over the second fin feature, wherein the first HK/MG is formed with a first threshold voltage and the second HK/MG is formed with a second threshold voltage, which is different than the first threshold voltage.

2. The method of claim 1, further comprising removing the oxidation layer and the oxide layer prior to forming the first HK/MG over the portion of the first fin feature.

3. The method of claim 1, wherein removing the second gate stack to form the second gate trench occurs after performing the annealing process.

4. The method of claim 1, the method further comprising: forming the oxidation layer in the second gate trench.

5. The method of claim 4, further comprising:
    forming a patterned hard mask (HM) to cover the oxidation layer over the second gate trench prior to performing the annealing process; and removing the patterned HM and the oxidation layer prior to forming the second HK/MG over the second fin feature.

6. The method of claim 1, further comprising:
forming a patterned hard mask (HM) to cover the second gate trench prior to performing the annealing process; and
removing the patterned HM prior to forming the second HK/MG over the second fin feature.

7. The method of claim 1, wherein performing the annealing process to change the composition of the portion of the first fin feature includes changing a composition of a semiconductor material below the oxide layer.

8. The method of claim 7, wherein the composition of the semiconductor material below the oxide layer is changed to have a higher atomic percentage of germanium (Ge).

9. A method comprising:
forming a first gate stack over a first fin feature and second gate stack over a second fin feature;
removing the first gate stack to form a first gate trench that exposes the first fin feature;
removing the second gate stack to form a second gate trench that exposes the second fin feature;
depositing an oxidation layer in the first gate trench;
performing an annealing process to change a composition of a portion of the first fin feature, wherein performing the annealing process to change the composition of the portion of the first fin feature includes forming an oxide layer under the oxidation layer, wherein the oxidation layer is different from the oxide layer;
removing the oxidation layer; and
forming a first high-k/metal gate (HK/MG) over the portion of the fin feature and a second HK/MG over a portion of the second fin feature, wherein the first HK/MG is formed with a first threshold voltage and the second HK/MG is formed with a second threshold voltage, which is different than the first threshold voltage.

10. The method of claim 9, further comprising removing the oxidation layer and the oxide layer prior to forming the first HK/MG over the portion of the first fin feature.

11. The method of claim 9, wherein depositing the oxidation layer in the first gate trench includes depositing the oxidation layer in the second gate trench.

12. The method of claim 11, further comprising:
forming a patterned hard mask (HM) to cover the oxidation layer over the second gate trench prior to performing the annealing process; and
removing the patterned HM and the oxidation layer prior to forming the second HK/MG over the second fin feature.

13. The method of claim 9, wherein performing the annealing process to change the composition of the portion of the first fin feature includes changing a composition of a semiconductor material below the oxide layer.

14. A method comprising:
forming a first gate stack over a first fin feature and second gate stack over a second fin feature;
removing the first gate stack to form a first gate trench that exposes the first fin feature;
removing the second gate stack to form a second gate trench that exposes the second fin feature;
forming an oxidation layer;
performing a thermal oxidation process to change a composition of a portion of the first fin feature, wherein performing the thermal oxidation process to change the composition of the portion of the first fin feature includes forming an oxide layer as an outer layer of the portion of the first fin feature, wherein the oxidation layer is different from the oxide layer; and
forming a first high-k/metal gate (HK/MG) within the first gate trench over the portion of the first fin feature and a second HK/MG within the second gate trench over the second fin feature, wherein the first HK/MG is formed with a first threshold voltage and the second HK/MG is formed with a second threshold voltage, which is different than the first threshold voltage.

15. The method of claim 14, wherein removing the second gate stack to form the second gate trench occurs after performing the thermal oxidation process.

16. The method of claim 15, further comprising:
forming a patterned hard mask (HM) to cover the second gate stack prior to removing the first dummy gate stack; and
removing the patterned HM prior to forming the second HK/MG over the second fin feature.

17. The method of claim 14, further comprising:
forming a patterned hard mask (HM) to cover the second gate trench prior to performing the thermal oxidation process; and
removing the patterned HM prior to forming the second HK/MG over the second fin feature.

18. The method of claim 14, further comprising removing the oxidation layer and the oxide layer prior to forming the first HK/MG over the portion of the first fin feature.

19. The method of claim 14, wherein the thermal oxidation process is conducted in oxygen ambient.

20. The method of claim 14, wherein performing the thermal oxidation process to change the composition of the portion of the first fin feature includes changing a composition of a semiconductor material below the oxide layer.

* * * * *